United States Patent [19]
Muraoka et al.

[11] Patent Number: 5,284,802
[45] Date of Patent: Feb. 8, 1994

[54] CONTAINER FOR SEMICONDUCTOR WAFER SAMPLE AND METHOD OF PREPARING SAMPLE

[75] Inventors: Hisashi Muraoka, Kanagawa; Takeyoshi Kakizaki, Tokyo, both of Japan

[73] Assignees: Purex Co., Ltd., Kanagawa; Kakizaki Mfg. Co., Ltd., Tokyo, both of Japan

[21] Appl. No.: 768,190
[22] PCT Filed: Feb. 19, 1991
[86] PCT No.: PCT/JP91/00205
  § 371 Date: Oct. 16, 1991
  § 102(e) Date: Oct. 16, 1991
[87] PCT Pub. No.: WO91/12631
  PCT Pub. Date: Aug. 22, 1991

[30] Foreign Application Priority Data
  Feb. 19, 1990 [JP] Japan .......................... 2-36029

[51] Int. Cl.$^5$ .................. H01L 21/00; H01L 21/02; H01L 21/66
[52] U.S. Cl. ........................... 437/225; 437/8; 437/228
[58] Field of Search .............. 437/225, 228, 8

[56] References Cited
FOREIGN PATENT DOCUMENTS
0144545  7/1986 Japan .

*Primary Examiner*—Tom Thomas
*Assistant Examiner*—B. Everhart
*Attorney, Agent, or Firm*—Keck, Mahin & Cate

[57] ABSTRACT

There is disclosed a container which conveys a semiconductor wafer and in which the face of the wafer is chemically treated. The container comprises a receiving platelike member and a cover made from a transparent or semitransparent plastic. The platelike member is made from a hydrophobic plastic such as a fluorocarbon resin and provides a quite small area in contact with the sample of the wafer to support it. Tonguelike portions extend steeply upwardly around the sample. When the cover is closed, the tonguelike portions are thrown toward the center of the container, bent, and pressed against the side surface of the sample. The container locks the sample without making contact with the face of the sample. The top cover is fitted over the platelike member to maintain the airtightness. To assure the airtightness, the container is equipped with an O ring and a tightening implement.

2 Claims, 1 Drawing Sheet

CONTAINER FOR SEMICONDUCTOR WAFER SAMPLE AND METHOD OF PREPARING SAMPLE

DESCRIPTION

1. Technical Field

The present invention relates to a wafer container for easily and correctly evaluating the contamination of the surface of a semiconductor wafer and also to a method of preparing a sample for analyzing the surface of the wafer sample received in such a wafer container.

2. Background Art

Contamination of the surfaces of wafers is the worst situation in semiconductor fabrication process. Therefore, it is necessary to evaluate the contamination level in various manufacturing steps. For this purpose, a sample wafer must be conveyed into an evaluation room or analysis room without being contaminated. To permit this conveyance, a clean container is necessary which can be sealed and prevents the wafer held in it from moving during conveyance.

An individual wafer container used conventionally has a cover which is screwed off. The container includes an intermediate plate provided with legs which are held against the fringe of the face of the wafer to lock it. The airtightness of the container is unsatisfactory. Furthermore, the legs of the intermediate plate make frictional contact with the face of the wafer and so the face tends to be damaged or powder tends to be produced due to abrasion. Accordingly, it is the common practice to use a plastic container holding tens of wafers as a wafer container for evaluating the contamination. This kind of plastic container is employed by manufacturers of silicon wafers to deliver manufactured wafers.

Evaluation of the surface of a wafer depends either on measurement of the density of particulates on the surface of the wafer or on analysis of the contaminative impurity elements. Today, semiconductor devices are highly sophisticated. Therefore, where the latter method is adopted, if a wafer is contaminated with a trace amount of a harmful element such as a heavy metal or alkali element, e.g., on the order of $10^{11}$ atoms/cm$^2$, then the manufacturing yield or the reliability is adversely affected. Nonetheless, conventional surface analysis apparatuses, such as AES, XPS, and EPMA, and even SIMS are not sensitive enough to analyze such a trace amount of element with certainty. Thus, a method of enriching the surface contamination is needed. Where the surface is coated with a film of an oxide, nitride, or the like, the film must be decomposed and then only the contaminative elements present in it must be enriched.

An excellent method of performing such an enrichment is disclosed in Japanese Patent Laid-Open No. 69531/1985. This method uses a sealed container in which a thin film is decomposed. Specifically, a container holding hydrofluoric acid, a wafer holder, and another container receiving liquid produced by decomposing the surface of the wafer with gaseous hydrofluoric acid evaporated from the hydrofluoric acid are installed in the sealed container. In this case, the amount of the liquid produced by the decomposition and existing in the sealed container is very small. In addition, the impurities contained in the hydrofluoric acid are not transferred into this liquid, because hydrofluoric acid in gas phase is utilized. Only the desired impurities excluding elements tending to less ionize such as Cu can be almost completely transferred into the liquid. That is, the impurities can be enriched into a trace amount of liquid. Flameless atomic absorption spectrometry is most adapted for the analysis of such liquid. Traces of impurities existing in the film on the surface are analyzed by this method.

In order to make such a surface analysis, the sample must be conveyed with a container as described above from the location where the sample is collected into an analysis room. Then, the container must be conveyed into a decomposition chamber. Thereafter, the sample must be transferred into the decomposition container.

During this conveyance, it is essential that the wafer be not contaminated. Therefore, it is necessary that the container used for the conveyance be not inferior in cleanliness to the decomposition container. Hence, the decomposition container is required to be cleaned quite carefully and accurately to enable the analysis of traces of impurities. Consequently, considerable time and labor are required for the cleaning operation. Similarly, the conveyance container must be cleaned. However, there exists no adequate method of directly determining whether the cleanliness of this conveyance container is acceptable, unlike the decomposition container. When the sample is shifted from one container into another, there arises a danger of contamination because of the used tweezers, environment, or atmosphere. The present invention is intended to provide a wafer container free of the foregoing problems.

DISCLOSURE OF THE INVENTION

In accordance with the present invention, a container for conveying a semiconductor wafer is also used as a container in which the surface is chemically processed, whereby the foregoing problems are solved. The container has a wafer-receiving platelike member made from a hydrophobic plastic such as a fluorocarbon resin and a top cover made from a transparent or translucent plastic. The platelike member which supports a sample wafer provides only a quite minute area in contact with the wafer to support it. The platelike member has tonguelike portions extending steeply upwardly from the body of the platelike member around the wafer. When the cover is closed, the tonguelike portions are thrown toward the center of the container and pressed against the side surface of the wafer. In this way, the tonguelike portions lock the wafer without making contact with the face of the wafer. The top cover is airtightly fitted over the platelike member. To assure the airtightness, the container is equipped with an O ring and a tightening implement.

BEST MODE FOR CARRYING OUT THE INVENTION

Figure 1:
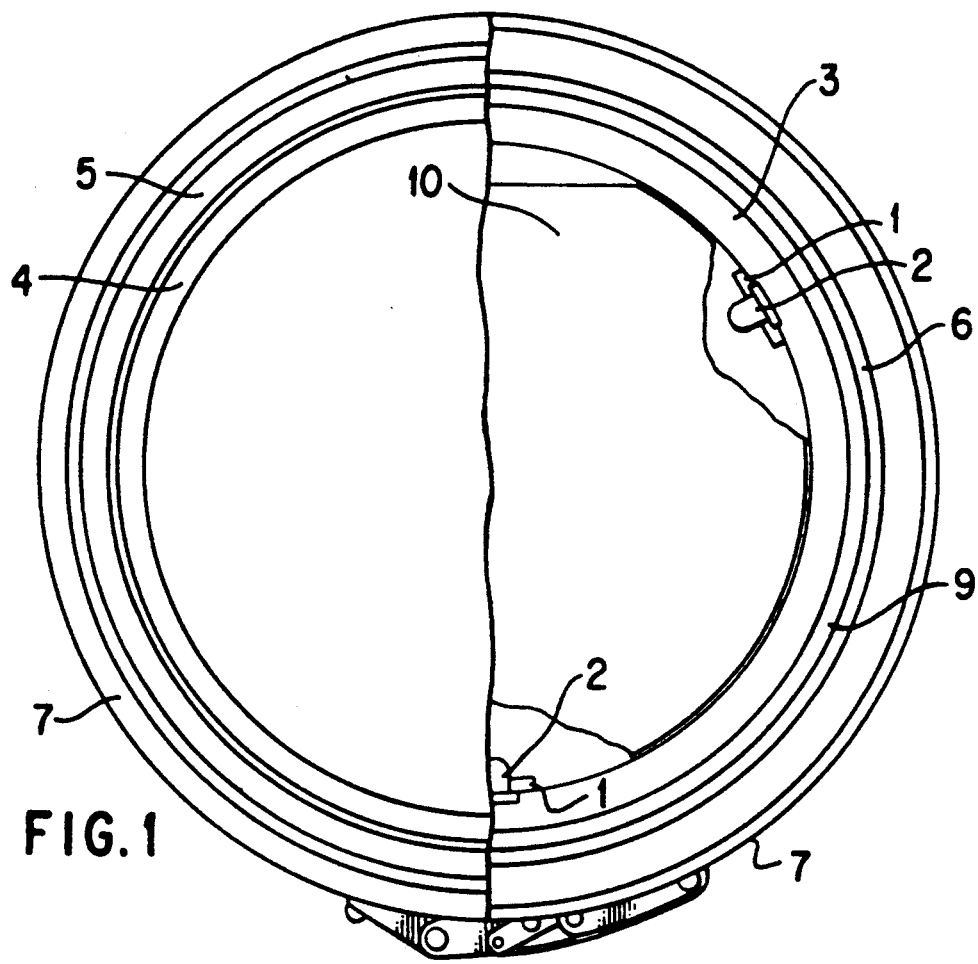
FIG. 1 is a front elevation partially in cross section of a container for evaluating the contamination of the surface of a semiconductor wafer, the container being built in accordance with the invention.
Figure 2:
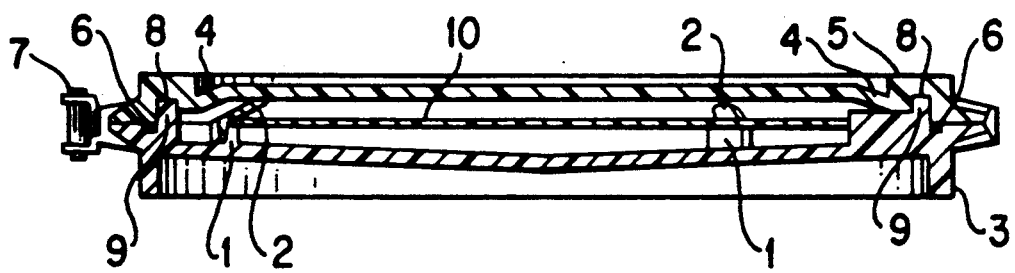
FIG. 2 is a vertical cross section taken through the center of the container shown in FIG. 1.
Figure 3:
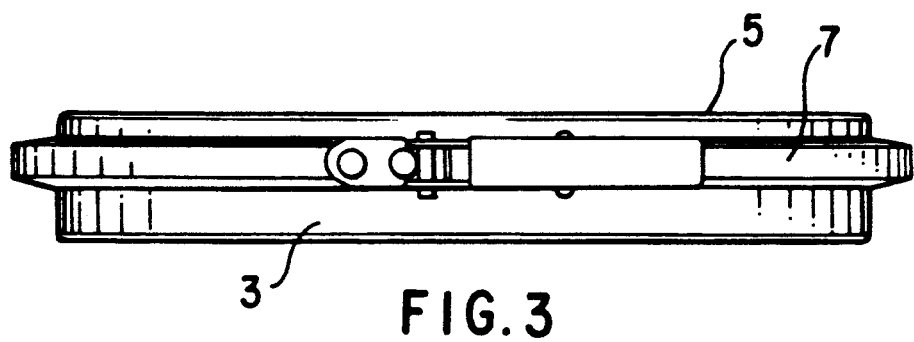
FIG. 3 is a side elevation of the container shown in FIG. 1.

Referring to the figures, there is shown a container embodying the concept of the present invention. This container consists principally of a circular platelike member 3 for receiving a wafer 10 and a cover 5. Both platelike member 3 and cover 5 are made from a fluoroplastic resin. The platelike member has three wafer support portions 1 spaced from each other. Each support portion 1 is shaped like a wedge and makes contact with the wafer 10 on a short line or at one point. The wafer 10 is placed on the wafer support portions 1. The container further includes three tonguelike portions 2 around the support portions 1. The cover 5 has an inclined surface 4 close to the fringe of its inner surface and is provided with a circumferential groove 8 around the fringe of the cover 5. The platelike member 3 has an annular ridge 9 formed around the fringe of the platelike member 3. The ridge 9 is fitted in the groove 8 to make the inside of the container airtight. When the cover 5 is sufficiently pushed against the platelike member 3 with an O ring 6 and a tightening implement 7, the tonguelike portions 2 extending steeply upwardly from the body of the platelike member 3 are bent toward the center of the container by the inclined surface 4 of the cover. Thus, the wafer 10 is locked. The airtightness inside the container is maintained by the O ring 6 and the tightening implement 7.

Before the container is used, it is sufficiently cleaned with the accuracy needed to clean a decomposition container for analyzing traces of impurities. The sample wafer 10 is conveyed from the location at which the sample is collected into an analysis room with the cleaned container. The contamination of the face of the wafer 10 undergoes evaluation.

First, a method of making an analysis of the wafer 10 after dissolving the surface of the wafer 10 with a trace amount of acid up to a depth of tens of Å is described. The cover 5 of the container conveyed in the analysis room is opened within a clean atmosphere. Then, 300 $\mu$l of a mixed acid consisting of 1 part by volume of nitric acid, 0.02 part by volume of hydrofluoric acid, and 1 part by volume of ultrapure water is introduced to the center of the wafer 10. In this case, the wafer 10 has a diameter of 6 inches. TAMAPURE-AA-SUPER (68%; impurities of principal metal elements are less than 0.02 ppb) produced by Tama Chemical Industrial Co., Ltd., Japan, is used as the aforementioned nitric acid. TAMAPURE-AA-100 (38%; impurities of metal elements are less than 0.1 ppb) produced by the same company is used as the hydrofluoric acid. Flameless atomic absorption spectrometry demonstrates that the ultrapure water contains less than 0.02 ppb of the element to be analyzed.

A disklike sheet having the same shape as the wafer is placed on droplets of the mixed acid. This sheet is made from a fluorocarbon resin and has been sufficiently cleaned. The cover is closed, and the container is sealed with the tightening implement. The sheet is pressed against the wafer 10 by the three tonguelike portions. The mixed acid forms a thin liquid layer sandwiched between the whole face of the wafer 10 and the disklike sheet. The mixed acid slightly etches away the face of the wafer 10. They are allowed to stand at room temperature for 10 to tens of minutes. As a result, the face of the wafer is dissolved up to a depth of tens of Å. The impurities adhering to the face and the impurities present in the dissolved region are captured by the mixed acid. After a lapse of a given time, the cover is opened, and the disklike sheet of fluorocarbon resin is slowly removed. The mixed acid forms liquid droplets on the wafer 10 to which hydrophobicity has been imparted.

The droplets do not adhere to the surface of the disklike sheet. The droplets are recovered by a micropipette to form a sample to be analyzed.

One of the sophisticated analyses effective to this liquid sample is total reflection fluorescent X-ray spectroscopy. A clean mirror wafer of silicon having a high degree of flatness is prepared separately for this analysis. The liquid droplet recovered by the micropipette is dried in the center of the mirror wafer. This portion is analyzed by this method. Normally, the detection limit of this analytical method is of the order of $10^{12}$ atoms for Fe, Cr, Ni, Cu, and other similar elements.

The amounts of the impurity elements originating from the 300 $\mu$l of the mixed acid used for the decomposition of the surface decreases from the above-described purity of less than 0.02 ppb to less than $6 \times 10^{10}$ atoms and so the impurity elements can be neglected completely. Since the analyzed liquid sample is obtained from the whole face of the wafer 10 having a diameter of 6 inches, the detection limit for these elements on the face of the wafer 10 is approximately equal to $5 \times 10^9$ atoms/cm$^2$. In this way, this method of preparing a sample to be analyzed is satisfactory for the evaluation of the contamination of the materials and the contamination occurring in the process.

As already described in the column of the "Background Art", a film of oxide or nitride formed on the wafer 10 is dissolved with vapor of hydrofluoric acid and then analyzed. We now give an example of this process. The used container has the same shape as the container used in the example described first. The cover of the container is made from transparent polycarbonate or the like or from a semitransparent fluorocarbon resin. In the latter case, a part of the cover of the semitransparent cover is especially thinned to permit one to visually check the completion of the dissolution. A platelike member 3 receiving a wafer 10 is made from a hydrophobic plastic such as a fluorocarbon resin to permit the liquid on the bottom surface to form droplets. In this example, an outer box made from a transparent plastic is used as a tightening implement. The present container is tightened between the cover of the box and the bottom. TAMAPURE-AA-SUPER (38%; impurities of principal metal elements are less than 0.02 ppb) produced by Tama Chemical Industrial Co., Ltd., Japan, is used as the hydrofluoric acid. The container is conveyed into an analysis room, and then the cover is opened. Subsequently, 300 $\mu$l of the mixed acid is introduced to the bottom of the receiving platelike member 3 through an orientation-flat gap in the sample wafer 10. The cover is closed, and the container is allowed to stand. The film is dissolved away by vapor of hydrofluoric acid. The film on the upper surface of the wafer 10 which is being dissolved can be seen. Since the lower surface is decomposed at a higher rate, the cover is opened after the decomposition of the upper surface is confirmed. Two kinds of liquid droplets produced by the decomposition of the upper and lower surfaces, respectively, are separately recovered. These two kinds of liquid droplets are samples to be analyzed. The recovery is carried out with a micropipette. If decomposition level in the liquid droplets is not so large, then a small amount of ultrapure water is added. Thereafter, all the droplets are collected to retrieve the liquids. If the film is thick, the amount of the added hydrofluoric acid is increased slightly. If the droplets produced by the decomposition are large, and if there is a possibility that the droplets on the lower surface fall, then the hydrofluoric acid on the bottom surface of the receiving platelike member 3 is added to the droplets produced by the decomposition to form a sample to be analyzed. The analysis is made in the same way as in the example described first. Total reflection fluorescent X-ray spectroscopy is also utilized.

Industrial Applicability

When the novel container is used to convey the wafer, the used face of the wafer 10 is not held down. The wafer 10 is certainly prevented from moving inside the container by the action of the tonguelike portions 2 pushed by the cover 5. Therefore, particulates such as dust of silicon or plastic which would otherwise be produced by abrasion are not produced. The container is closed up, since the receiving platelike member 3 is fitted in the groove 8 in the cover 5. Furthermore, the container is sealed by the outer O ring 6. Hence, the container is prevented from being contaminated from the outside.

Since the container used for conveyance serves also as a container used for evaluation, it is not necessary to clean the conveyance container especially carefully. Consequently, the density of the particulates on the face of the sample wafer 10 can be measured optically inside the conveyance container. Also, a sample chemically contaminated can be prepared.

When a sample to be analyzed is prepared, the analyzed portion of the sample wafer 10 can be decomposed directly by a volatile acid or by vapor of the acid. In this case, the volume inside the container is small and its airtightness is high and, therefore, only a quite small amount of the acid is necessary. In consequence, an analysis can be made with sufficient sensitivity, using commercially available chemicals of high purity. Further, the container permits one to visually check the completion of the decomposition. This minimizes the time taken to prepare a sample to be analyzed.

I claim:

1. A container for receiving a sample of a semiconductor wafer, comprising:

a receiving platelike member (3) which is made from a synthetic resin and in which the sample (10) of the wafer is received;

a cover (5) mounted over the platelike member (3) and made from a synthetic resin, the cover (5) having an inclined surface (4) in the inner surface thereof;

three or more tonguelike portions (2) extending steeply upwardly around the wafer (10), the tonguelike portions being circumferentially spaced from each other;

and wherein when the cover (5) is pushed against the platelike member with a large force, the tonguelike portions (2) are bent by the inclined surface (4) of the cover (5) in the direction in which the wafer (10) is urged to support it, and the cover (5) is maintained airtightly fitted over the platelike member (3).

2. A method for preparing a sample of a semiconductor wafer, comprising:

fabricating a receiving platelike member (3) and a cover (5) mounted over the platelike member out of a synthetic resin to form a container receiving the semiconductor wafer;

receiving the sample of the wafer (10) in the platelike member (3);

airtightly fitting the cover (5) over the platelike member (3);

introducing a trace amount of a volatile acid into the container to dissolve away the film on the face of the sample of the wafer (10) and impurities adhering to it; and fabricating the cover (5) with an inclined surface (4) in this surface thereof; fabricating the receiving platelike member with three or more tonguelike portions (2) extending steeply upwardly around the wafer (10), the tonguelike portions being circumferentially spaced from each other; and pushing the cover (5) against the platelike member (3) with a large force, whereby the tonguelike portions (2) are bent by the inclined surface (4) of the cover (5) in the direction in which the wafer (10) is urged to support it.

* * * * *